United States Patent

Hyland et al.

(10) Patent No.: US 6,641,440 B1
(45) Date of Patent: Nov. 4, 2003

(54) ELECTRICAL CONNECTOR WITH POWER MODULE

(75) Inventors: James H. Hyland, Hummelstown, PA (US); Kevin E. Walker, Hershey, PA (US); Iosif R. Korsunsky, Harrisburg, PA (US); Jared Joseph Smalley, Jr., Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/262,250

(22) Filed: Sep. 30, 2002

(51) Int. Cl.⁷ .............................................. H01R 33/945
(52) U.S. Cl. ........................................ 439/620; 439/676
(58) Field of Search ................................. 439/620, 676, 439/540.1, 607

(56) References Cited

U.S. PATENT DOCUMENTS

| | | | |
|---|---|---|---|
| 3,988,639 A | * 10/1976 | Preiser et al. | 361/58 |
| 4,384,331 A | * 5/1983 | Fukuhara et al. | 701/115 |
| 4,878,858 A | 11/1989 | Dechelette | |
| 4,974,075 A | * 11/1990 | Nakajima | 348/75 |
| 5,083,945 A | 1/1992 | Miskin et al. | |
| 5,282,759 A | 2/1994 | Sakamoto et al. | |
| 5,378,172 A | 1/1995 | Boberts | |
| 5,766,041 A | 6/1998 | Morin et al. | |
| 5,775,946 A | 7/1998 | Briones | |
| 5,788,538 A | 8/1998 | Belopolsky et al. | |
| 6,238,247 B1 | * 5/2001 | Belopolsky et al. | 439/620 |
| 6,302,741 B1 | * 10/2001 | Fasold et al. | 439/620 |
| 2002/0119702 A1 | * 8/2002 | Chen | 439/607 |

* cited by examiner

*Primary Examiner*—Dean A. Reichard
*Assistant Examiner*—Jinhee Lee
(74) *Attorney, Agent, or Firm*—Wei Te Chung

(57) ABSTRACT

An electrical connector (100) for mounted on a main printed circuit board (PCB) includes an insulative housing (1) defining a plurality of cavities (11, 12), a plurality of contacts (31, 32) received in the housing and extending into the cavities, and a shield member (21, 22) substantially surrounding the housing. An internal PCB (53), a first and a second magnetic modules (61, 62), and a power module (9) are received in a rear opening (13) of the housing. A plurality of conductors (82) electrically connect the internal PCB with the first and the second magnetic modules and the power module. An internal ground plate (7) electrically engages with the internal PCB and mechanically engages with the first and the second magnetic modules and the power module.

7 Claims, 10 Drawing Sheets

US 6,641,440 B1

ELECTRICAL CONNECTOR WITH POWER MODULE

CROSS-REFERENCE TO RELATED APPLICATION

This application is related to US Patent application entitled "ELECTRICAL CONNECTOR WITH REAR GROUND PLATE", Ser. No. 10/279,807, which is contemporaneously filed, and assigned to the common assignee.

BACKGROUND OF THE INVENTION

1. Field of the Invention

The present invention relates to electrical connectors and more particularly, to a multi-port modular jack mounted on a printed circuit board (PCB).

2. Description of the Prior Art

Modular jacks in high speed application usually use filters such as three-terminal capacitors, common mode choke coils or inductors to suppress noises. For example, U.S. Pat. No. 5,015,204 issued to Sakamoto et al. on May 14, 1991 teaches use of a common-mode choke arranged in a connector housing around which the contact leads of an RJ-45 modular jack connector are integrally wound. In Sakamoto design, the voluminous common-mode choke takes up a substantial portion of the connector housing, although only two signal-conducting leads are used. Furthermore, the respective leads need a certain rigidity to provide resilient forces to continuously facilitate a secure contact with an associated modular plug connector. However, this creates difficult manufacturing conditions, especially when the rigid wires, consisting of phosphor bronze, have to be wound around the conductive core of the choke coil.

U.S. Pat. No. 5,069,641 issued to Sakamoto et al. on Dec. 3, 1991 avoids such difficulties by the use of a printed circuit board to receive the common-mode choke coils or to receive electronic chip inductances. The printed circuit board not only requires its own space, but also need several additional production steps in order to connect it to the components and the leads thereof. Moreover, in high speed applications, more functional components and novelty circuitry design are usually needed for better electrical performance, which also enlarge the electronic appliance and complicated the assemble process.

Any improvement on how to make the modular jack compact and easy to assemble is welcome.

BRIEF SUMMARY OF THE INVENTION

A main object of the present invention is to provide a compact electrical connector with a power module.

An electrical connector for mounted on a main printed circuit board (PCB) includes an insulative housing defining a plurality of cavities, a plurality of contacts received in the housing and extending into the cavities, and a shield member substantially surrounding the housing. An internal PCB, a first and a second magnetic modules, and an electronic component are received in a rear opening of the housing. A plurality of conductors electrically connect with the internal PCB with the magnetic modules and the electronic component. An internal ground plate electrically engages with the internal PCB and mechanically engages with the first and the second magnetic modules and the electronic component.

Other objects, advantages and novel features of the invention will become more apparent from the following detailed description when taken in conjunction with the accompanying drawings.

DETAILED DESCRIPTION OF THE INVENTION

Figure 1:
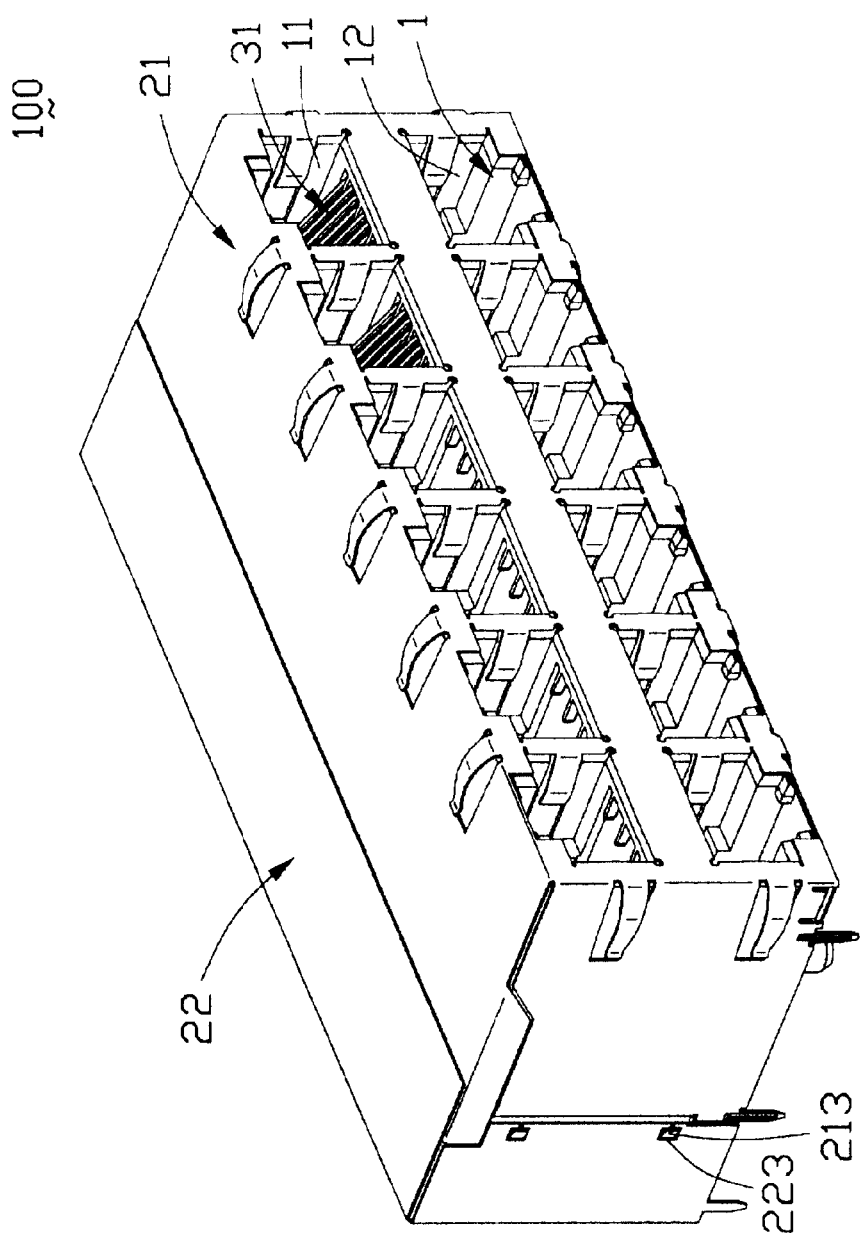
FIG. 1 is a perspective view of a modular jack according to the present invention, wherein two insert modules are received in the housing.
Figure 8:
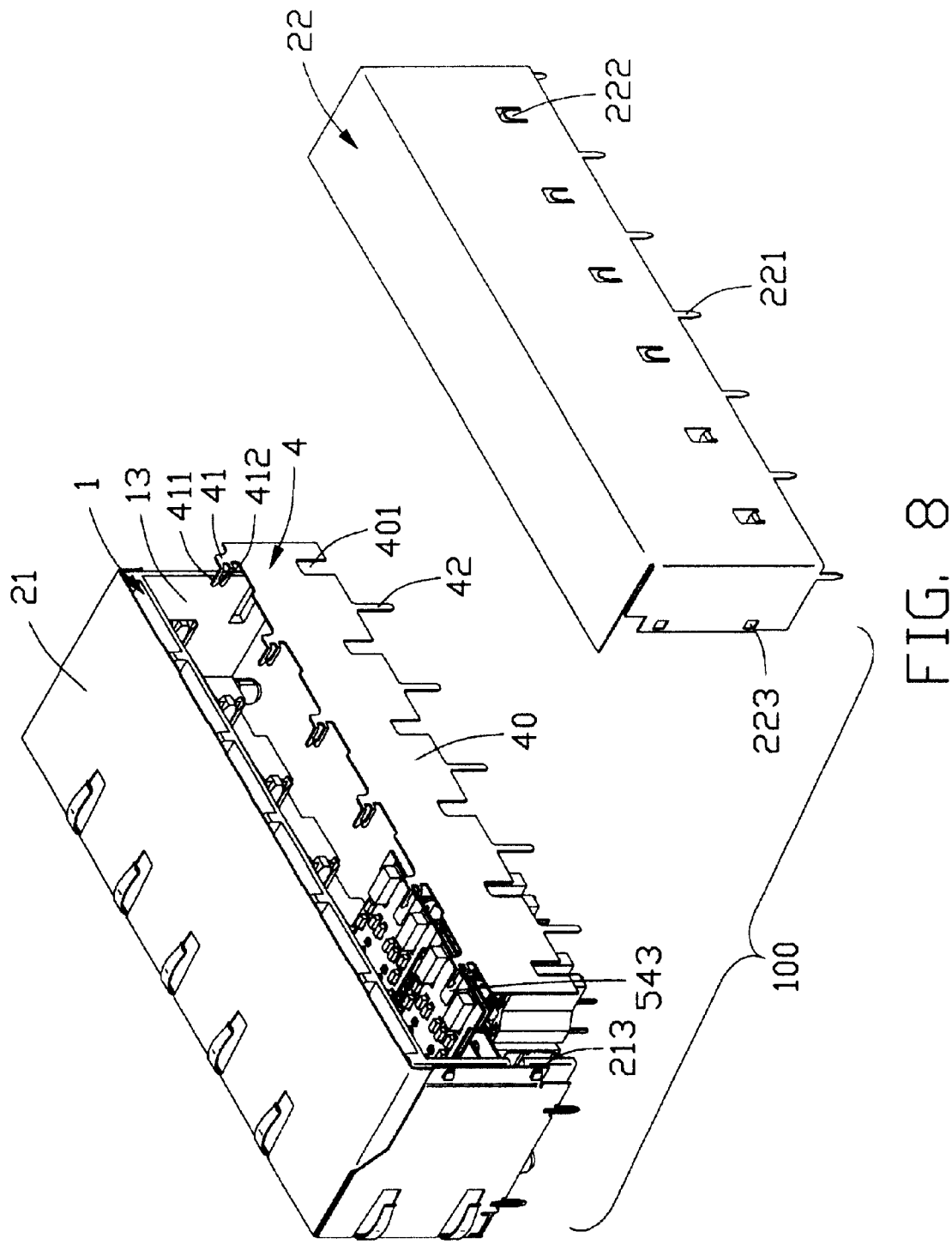
FIG. 8 is a partially assembled view of the modular jack, wherein only two insert modules are received in the housing.

Referring to FIGS. 1 and 8, a modular jack 100 mounted on a main printed circuit board (PCB, not shown) includes an insulative housing 1, a plurality of insert modules 3 (shown in FIG. 2) received in the housing 1, a rear ground plate 4, and a front and rear outer shells 21, 22 substantially surrounding and shielding the housing 1. The modular jack 100 is preferably a multi-port modular jack, which defining a plurality of upper and lower cavities 11, 12 for receiving a plurality of mating modular plugs (not shown) and a rear opening 13 for partially receiving the insert modules 3. The main PCB has a plurality of signal through holes for signal transmitting, grounding through holes for grounding, and power holes for providing power with a predetermined voltage.

Figure 10:
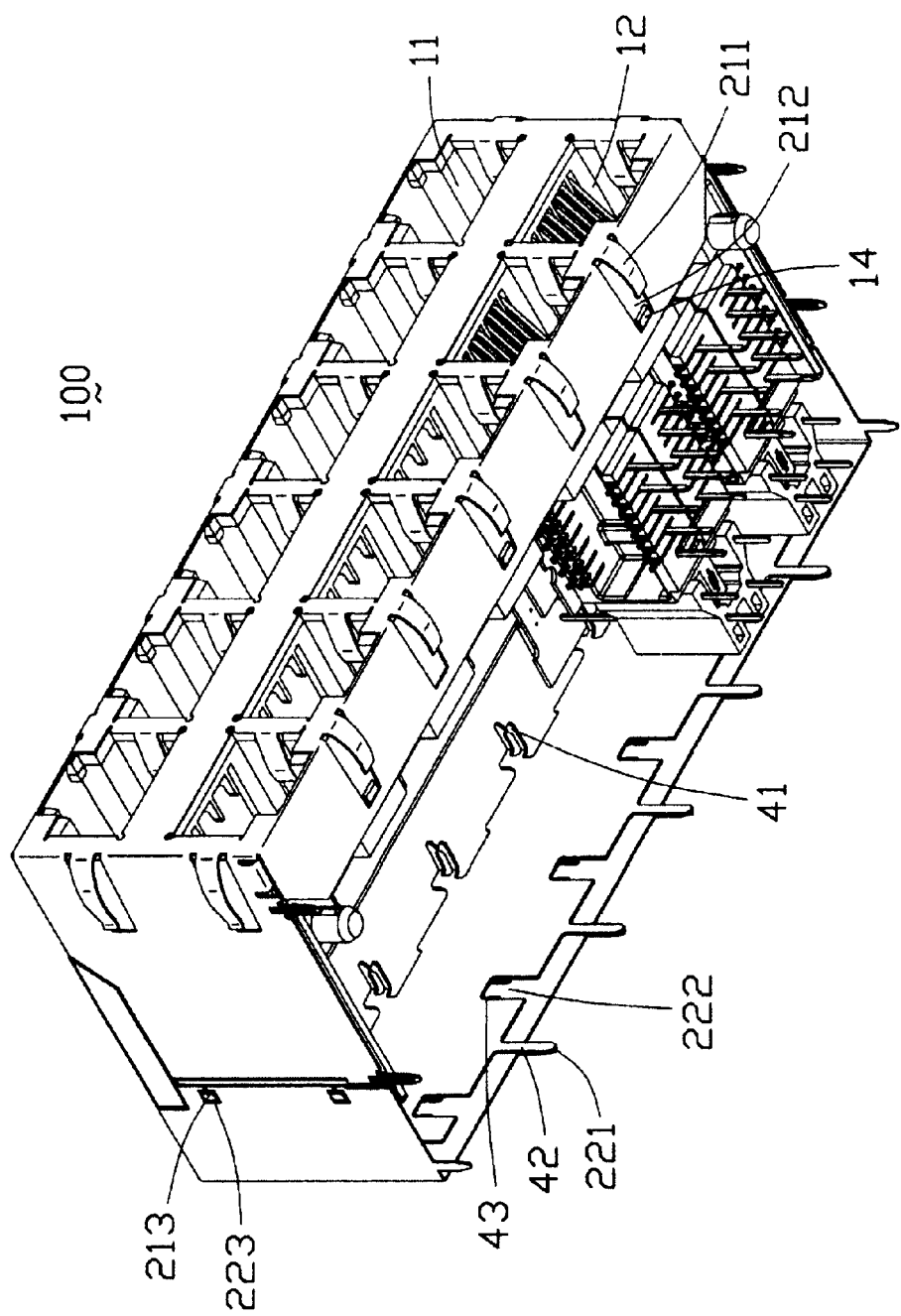
FIG. 10 is another assembled view of FIG. 8 taken from a bottom aspect.

Referring to FIGS. 1, 8 and 10, The housing 1 is substantially rectangular-shaped and forms a plurality of protrusions 14 on a lower surface for securing the front outer shell 21 to the housing 1, which will be discussed later.

The front outer shell 21 is stamped from one metal sheet and is folded for surrounding a front portion of the housing 1. The front outer shell 21 defines a plurality of retaining barbs 213 in opposite sides thereof. A plurality of lower tabs 211 projects downwardly from a lower portion of the front outer shell 21 by stamping, thereby defining a plurality of holes 212. The rear outer shell 22 is stamped from one metal sheet and is folded for surrounding a rear portion of the housing 1. The rear outer shell 22 defines a plurality of retaining cutouts 223 corresponding to the retaining barbs 213 of the front outer shell 21. A plurality of solder tails 221 descent from a lower portion of the rear outer shell 22. A plurality of retaining tabs 222 are formed on a middle portion of the rear outer shell 22.

Figure 2:
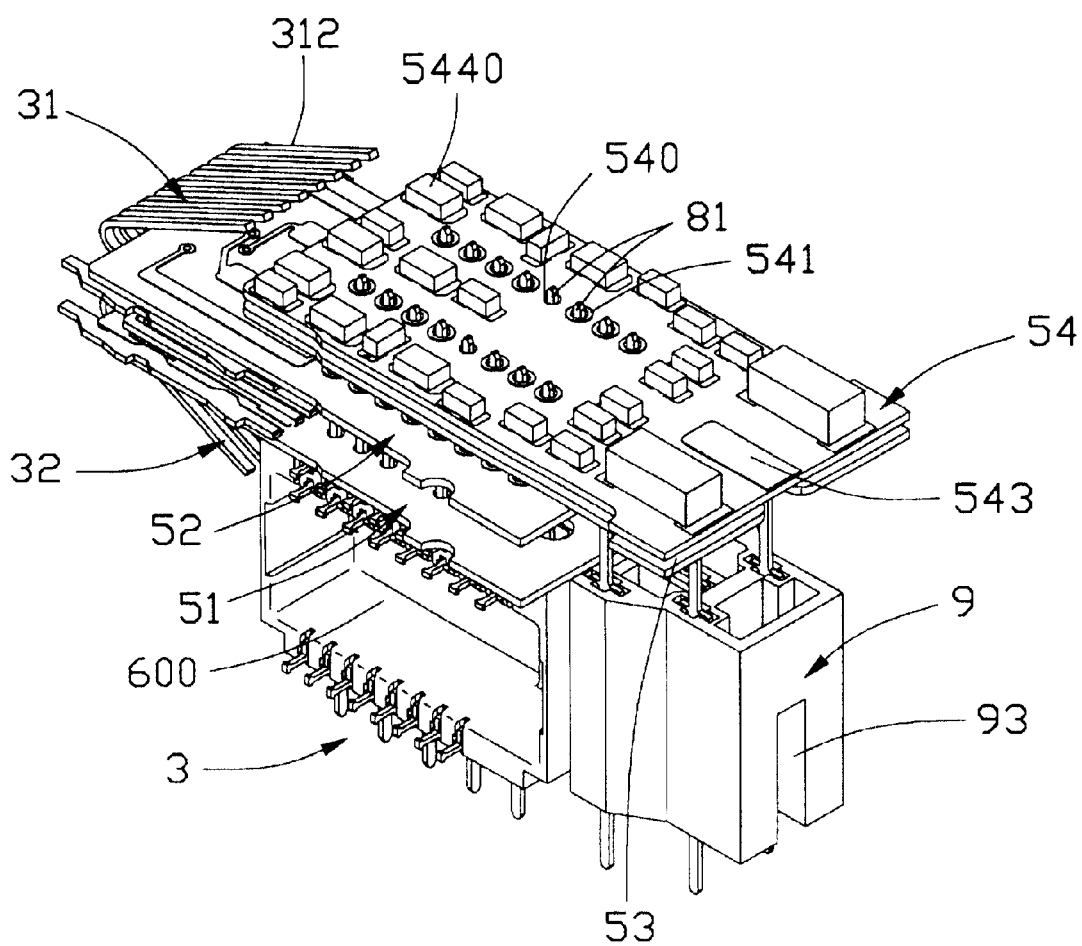
FIG. 2 is a perspective view of an insert module.
Figure 3:
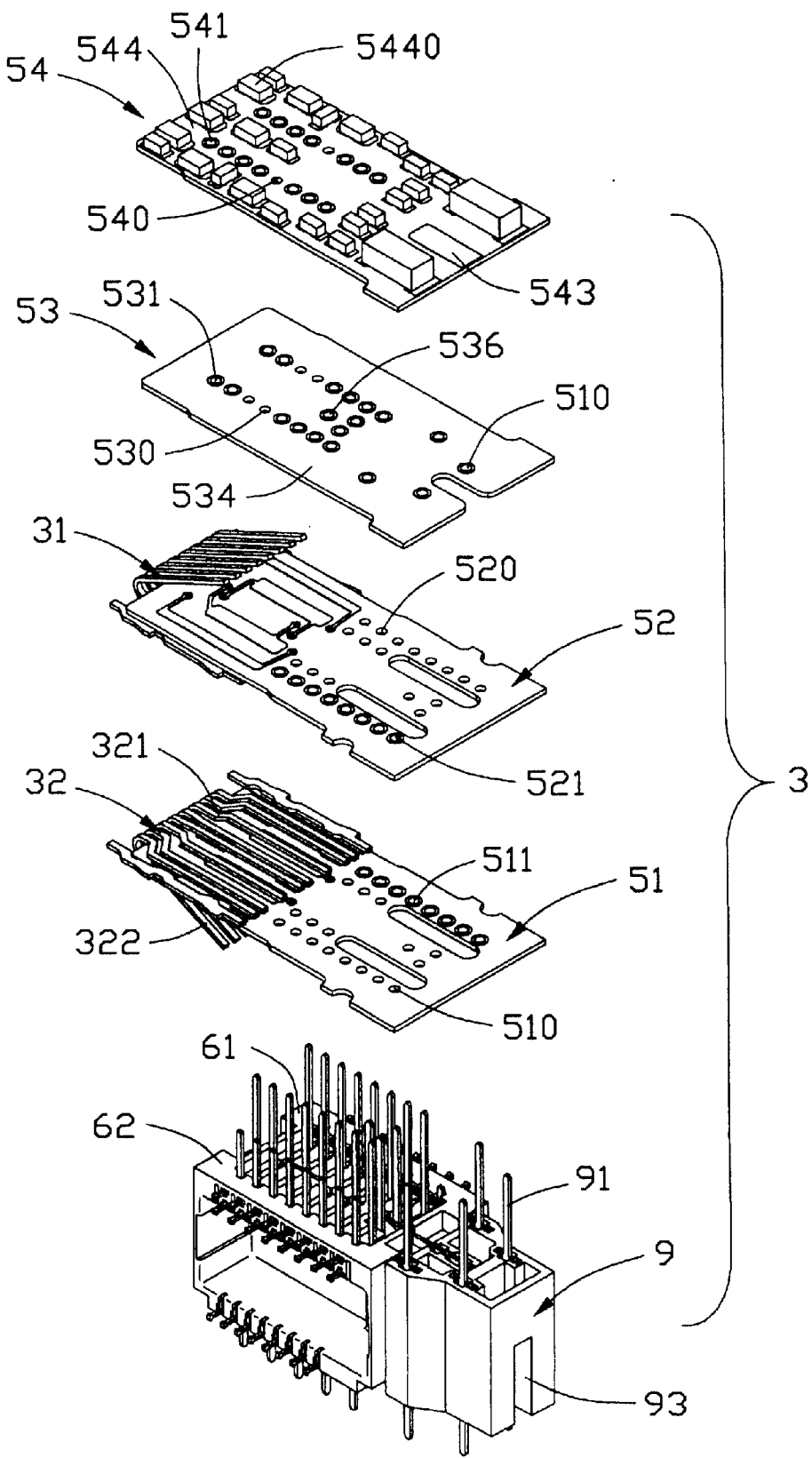
FIG. 3 is an exploded view of FIG. 2.
Figure 4:
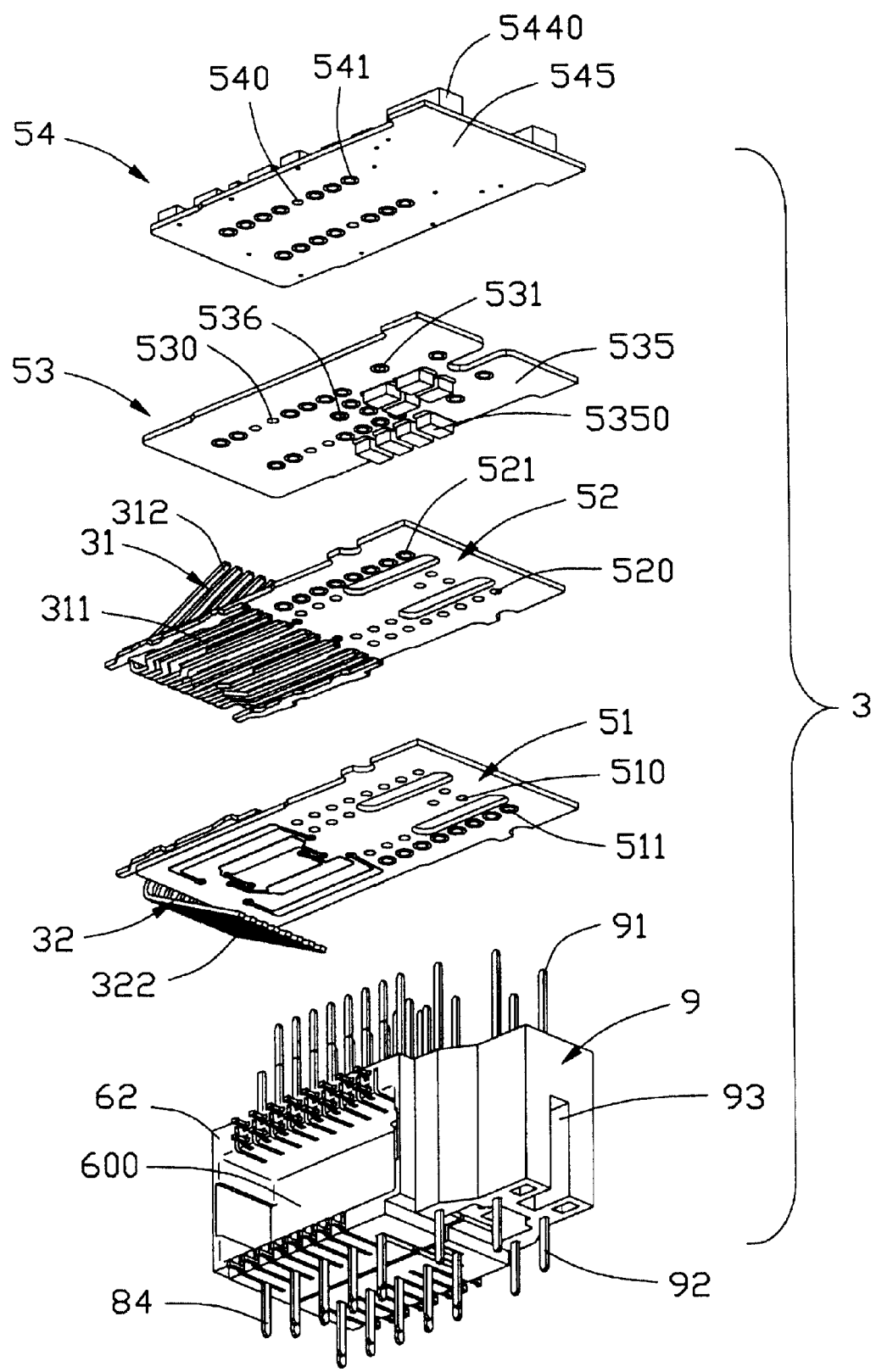
FIG. 4 is another exploded view of FIG. 2 taken from a bottom aspect.

Referring to FIGS. 2, 3 and 4, each insert module 3 includes a plurality of upper and lower contacts 31, 32, a first, second, third and fourth internal PCBs 51, 52, 53, 54, and a magnetic and power assembly 6. The upper and lower contacts 31, 32 respectively includes upper and lower solder portions 311, 321 respectively surface mounted to the second and first internal PCBs 52, 51, and upper and lower contact portions 312, 322 respectively extending into the upper and lower cavities 11, 12 for electrically engaging with corresponding modular plugs.

The first, second, third and fourth PCBs 51, 52, 53, 54 respectively define a plurality of through holes 510, 520, 530, 540 and a plurality of soldering holes 511, 521, 531, 541. The third and fourth internal PCBs 53, 54 respectively include a plurality of electronic elements 5350, 5440 on an lower surface 535 of the third internal PCB 53 and an upper surface 544 of the fourth internal PCB 54. The electronic elements 5350, 5440 are preferably resistors and capacitances. The third and the fourth PCBs 53, 54 respectively includes a grounding soldering hole 536 and a grounding pads 543 for grounding.

Figure 5:
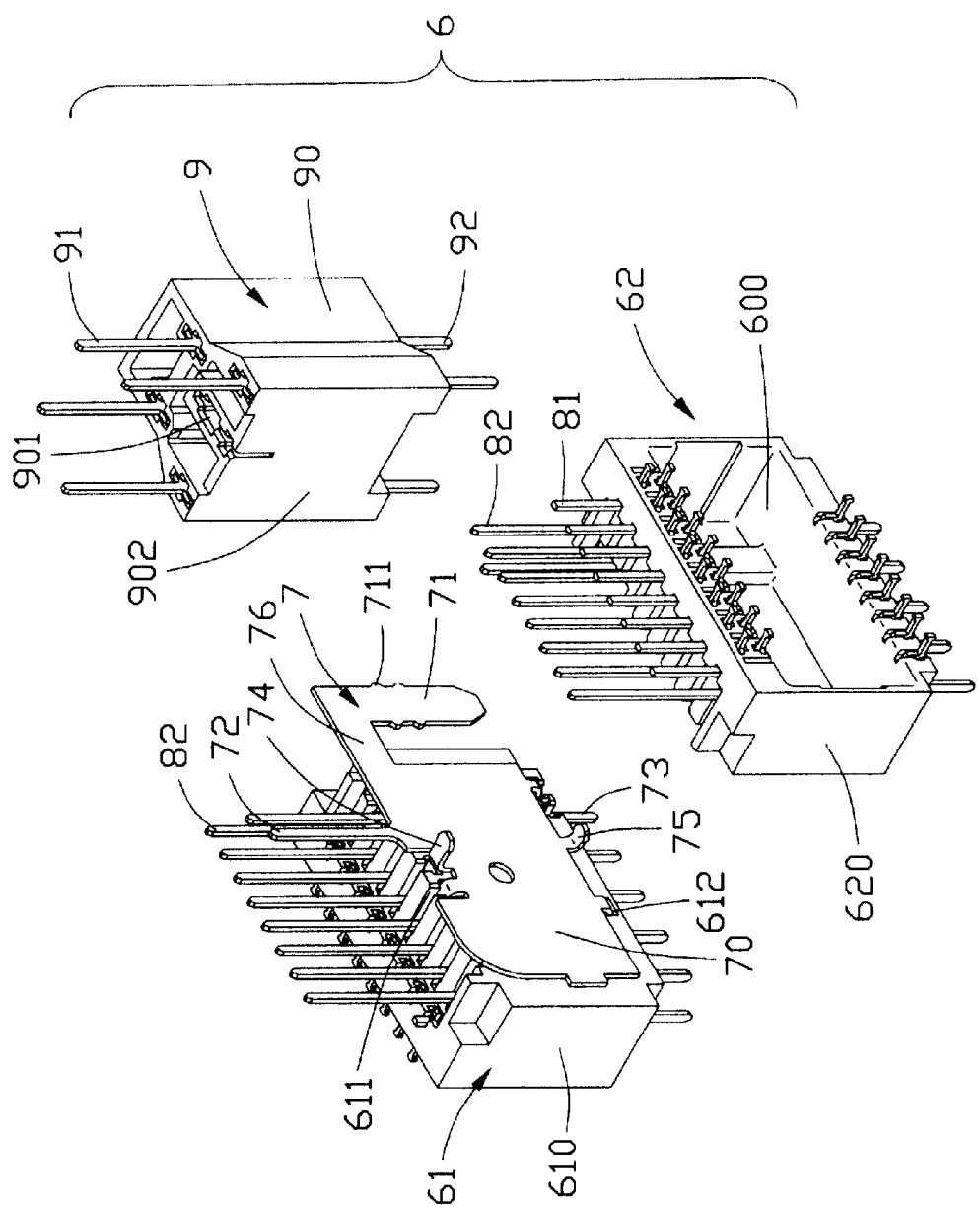
FIG. 5 is a partially exploded view of a magnetic and power assembly, with an internal ground plate engaging with a first magnetic module.
Figure 6:
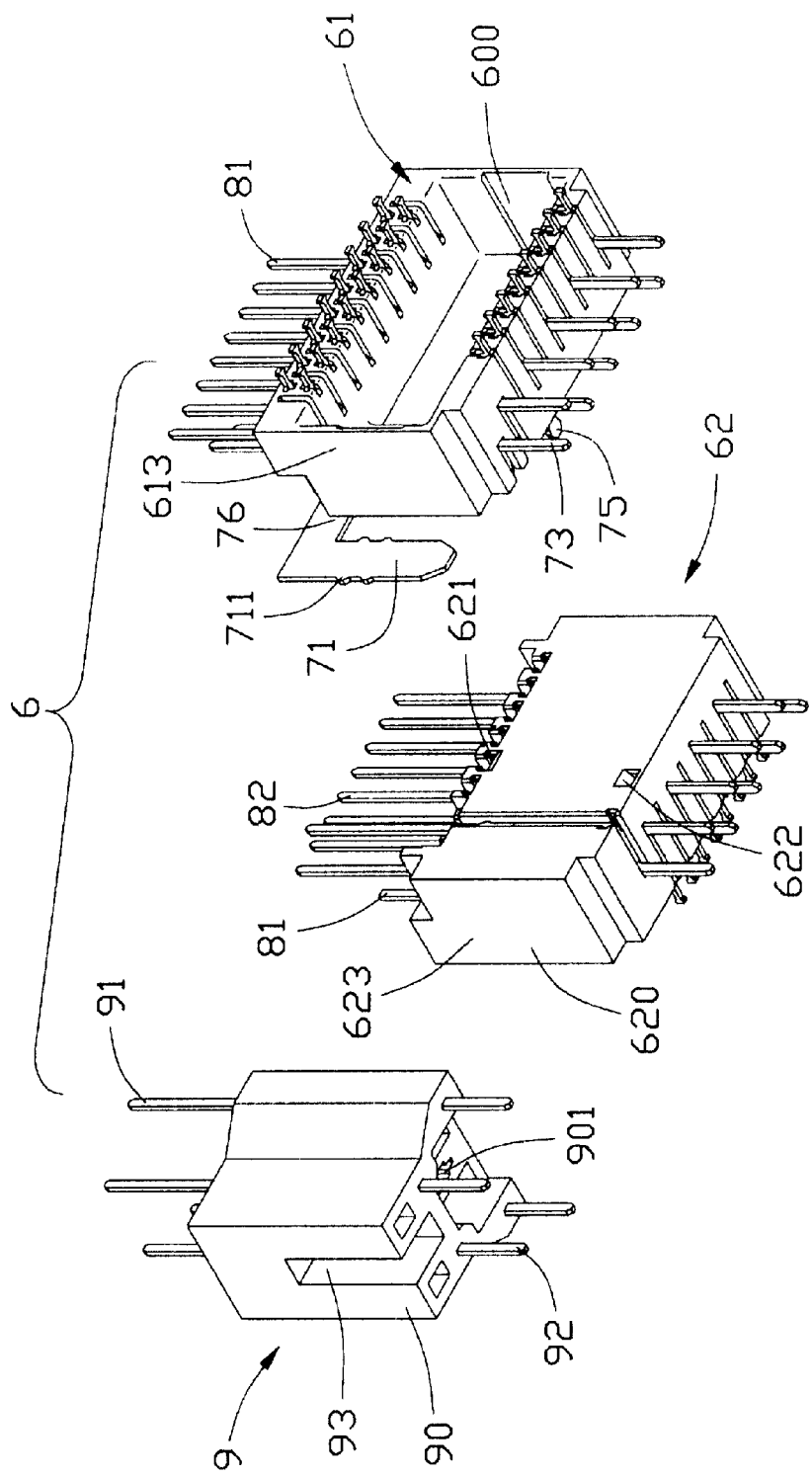
FIG. 6 is another partially exploded view of the magnetic and power assembly similar to FIG. 5, taken from a different view of point.
Figure 7:
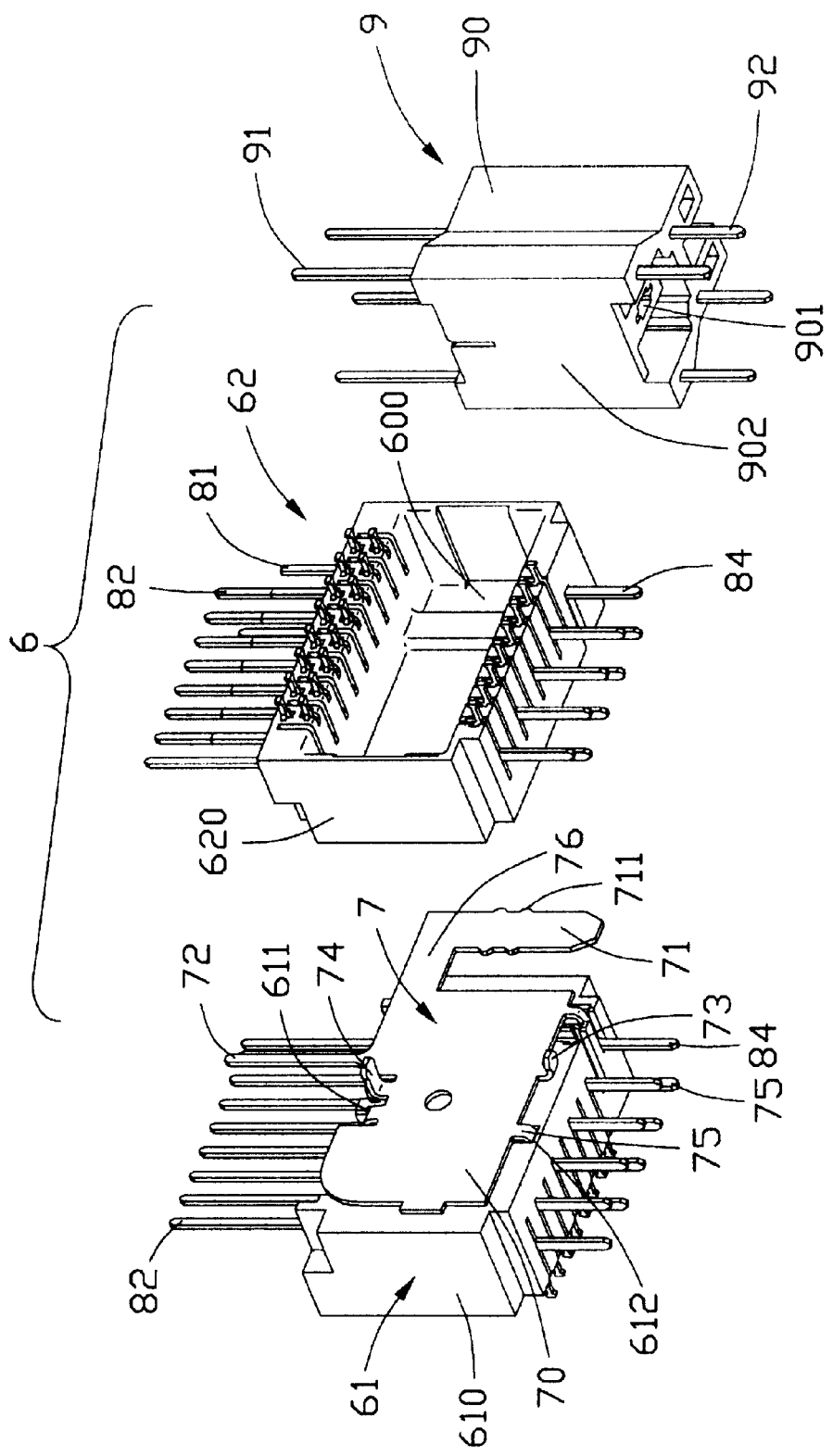
FIG. 7 is still another partially exploded view of the magnetic and power module assembly similar to FIGS. 5, 6 from a different view of point.

Referring to FIGS. 5, 6 and 7, the magnetic and power assembly 6 includes a first and a second magnetic modules 61, 62, a power module 9 and an internal ground plate 7. The power module 9 includes an insulative block 90 and a plurality of upper and lower conductors 91, 92 respectively extending from upper and lower portions of the insulative block 90. The insulative block 90 defines a vertical recess 901 through upper and lower surfaces thereof, and a rear opening 93 in a rear portion thereof.

The first and second magnetic modules 61, 62 respectively include a first and second insulative boxes 610, 620. A plurality of short and long conductors 81, 82 are mounted in an upper portion of the first and second insulative boxes 610, 620 and extend upwardly. A plurality of lower pins 84 are mounted in a lower portion of the first and the second insulative boxes 610, 620 and extend downwardly. Each of the first and second insulative boxes 610, 620 defines a chamber 600 for receiving a plurality of magnetic coils (not shown) therein. The magnetic coils are electrically connected with the conductors 81, 82, 84.

The first and second insulative boxes 610, 620 respectively define a plurality of recesses 611, 621 in upper portions thereof and indentions 612, 622 in lower portions thereof. The ground plate 7 has a generally planar body portion 70, a side plate 71, and a connecting portion 76 connecting the side plate 71 with the planar portion 70. A plurality of barbs 711 are formed on opposite sides of the side plate 71. A grounding pin 72 extends upwardly from an upper portion of the body portion 70. A grounding tail 73 extends downwardly from a lower portion of the body portion 70 and offsets from the body portion 70. A pair of upper retaining barbs 74 extends from an upper edge of the body portion 70 and respectively toward the first and the second insulative boxes 610, 620. A pair of lower barbs 75 extends from a lower edge of the body portion 70 and respectively toward the first and the second insulative boxes 610, 620.

Referring to FIGS. 3, 4 and 5, the upper retaining barbs 74 of the internal ground plate 7 respectively engage with a corresponding recess 611 of the first insulative box 610 and a corresponding recess 621 of the second insulative box 620. The lower retaining barbs 75 respectively engaging with the indention 612 of the first insulative box 610 and the indention 622 of the second insulative box 620. A planar side surface 902 of the power module 9 abuts against planar side surfaces 613, 623 of the first and the second magnetic modules 61, 62. The side plate 71 extends into the recess 901 of the power module 9 with the barbs 711 interferentially engaging with an inner surface of the recess 901, whereby the first and the second magnetic modules 61, 62 and the power module 9 are tightly assembled as a magnetic and power assembly 6 as shown in FIG. 3 or FIG. 4.

Referring to FIGS. 2, 3 and 4, the short conductors 81 of the first magnetic module 61 extend through the first internal PCB 51, and are soldered in the soldering holes 521 of the second internal PCB 51. The short conductors 81 of the second magnetic module 62 extend through and soldered in the soldering holes 511 of the first internal PCB 51. Therefore, electrical connections between the upper contacts 31 with the first magnetic module 61 and the lower contacts 32 with the second magnetic module 62 are established by the short conductors 81, whereby the magnetic modules 61, 62 act as signal conditioning devices for respectively suppressing noises induced by the upper and the lower contacts 31, 32, which is well known to those skilled in the art.

As shown in FIG. 2, the third and fourth internal PCBs 53, 54 are closely stacked with a lower surface 545 of the fourth internal PCB 54 close to an upper surface 534 of the third internal PCB 53. Lower ends of the long conductors 82 electrically connect with corresponding magnetic coils of the first and the second magnetic modules 61, 62. A number of the long conductors 82 extend through the corresponding through holes 510, 520 of the first and the second internal PCBs 51, 52 and are soldered in the corresponding soldering holes 521 of the third internal PCB 53. The other long conductors 82 extend through the corresponding through holes 510, 520, 530 of the first, second and third internal PCBs 51, 52, 53 and soldered in the corresponding soldering holes 541 of the fourth internal PCBs 54. Two of the long conductors 82 extend through and are soldered in corresponding soldering holes 531, 541 of both the third and fourth PCBs 53, 54, thereby electrically connecting the third and fourth PCBs 53, 54 and forming a resistive and capacitive array between the electronic elements 5350, 5440 and performing as a noise suppressing module. The arrangement of the electrical elements 5350, 5440 is well known to those skilled in the art, a detailed description is omitted herein. The grounding pin 72 of the ground plate 7 extends through the corresponding through holes 510, 520 of the first and the second internal PCBs 51, 52 and soldered in a corresponding soldering hole 531 of the third internal PCB 53, and the grounding tail 73 extending through and soldering in the corresponding grounding hole of the main PCB for grounding. The upper conductors 91 of the power module 9 extend through the corresponding through holes 510, 520 of the first and second internal PCBs 51, 52 and soldered in the corresponding soldering holes 536 of the third PCB, and the lower conductors 92 of the power module 9 are soldered in the corresponding power holes of the main PCB, thereby carrying power signal with a predetermined voltage to the third and the fourth internal PCBs 53, 54. The first, second, third and fourth PCBs 51, 52, 53, 54 and the magnetic and power assembly are tightly assembled as an insert module 3 as shown in FIG. 2.

Referring to FIG. 8, the rear ground plate 4 includes a generally planar body plate 40, a plurality of upper grounding contact 41 projecting forwardly from an upper portion of the body plate 40 and generally perpendicular to the body plate 40, a plurality of lower grounding contacts 42 extending downwardly from a lower portion of the body plate 40. The body plate 40 defines a plurality of hollow portions 401 in a lower portion thereof. The grounding contact 41 is preferably forked with an upper and a lower tabs 411, 412.

In assembly, the insert modules 3 are inserted into the insulative housing 1 from the rear opening 13 of the insulative housing 1. The rear ground plate 4 is attached to the insert modules 3 with the upper and lower tabs 411, 412 of the upper ground contacts 41 receiving a rear portion of the fourth internal PCB 54 therein and engaging with grounding tabs 543 of the fourth internal PCB 54.

Figure 9:
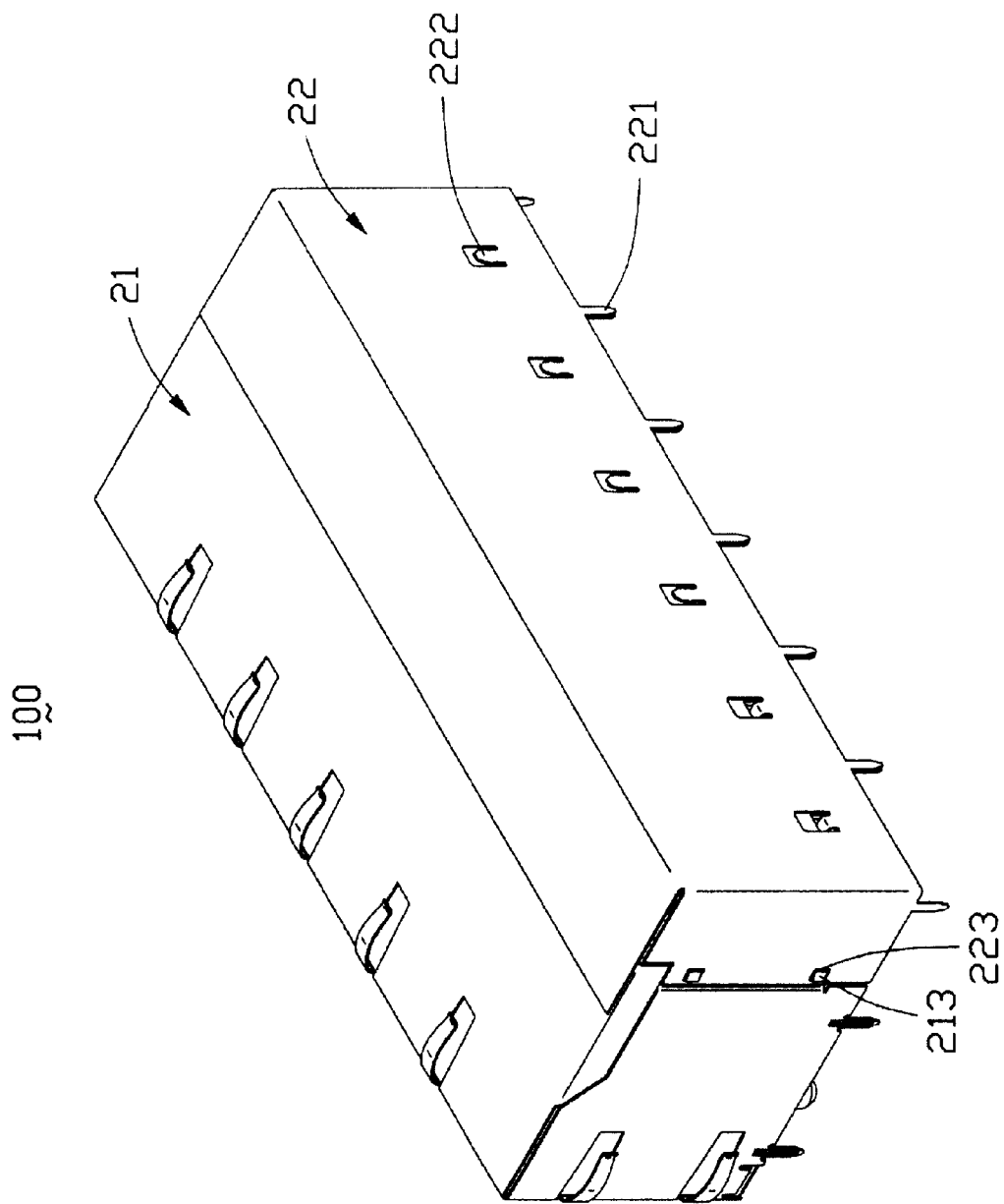
FIG. 9 is an assembled view of FIG. 8.

Referring to FIGS. 1, 9 and 10, the front outer shell 21 substantially surrounds the front portion of the insulative housing 1 and the rear shell 22 substantially surrounds the rear portion of the insulative housing 1. The holes 212 of the front outer shell 21 engage with corresponding protrusions 14 of the insulative housing 1. The retaining cutouts 223 of the rear outer shell 22 engage with the retaining barbs 213 of the front outer shell 21. The retaining tabs 222 of the rear outer shell engage with the rear opening 93 of the power module 9 through the hollow portion 401 of the rear ground plate 4, thereby securing both the rear ground plate 4 and the rear outer shell 22 to the housing 1. Each lower grounding contact 42 of the rear ground plate 4 abuts against a corresponding solder tail 221 of the rear outer shell 22 and soldered in the same corresponding grounding through holes of the main PCB. The grounding tails 73 are soldered to corresponding grounding holes of the main PCB.

In another embodiment of the invention, the power module 9 includes two parts. The two parts of the power module are respectively integrally made with the first and the second magnetic modules 61, 62 to form a first and a second magnetic and power modules. The first and second magnetic and power modules are secured to each other by the internal ground plate 7.

It is to be understood, however, that even though numerous, characteristics and advantages of the present invention have been set fourth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for being mounted on a main printed circuit board (PCB) comprising:
   an insulative housing defining at least one cavity and an opening communicating with the at least one cavity;
   a plurality of contacts extending into the at least one cavity for electrically connecting with a mating connector;
   an internal printed circuit board received in the opening of the insulative housing;
   a magnetic module and an electronic component received in the opening of the housing;
   a plurality of conductors electrically connecting the internal printed circuit board with the magnetic module and the electronic component; and
   an internal ground plate electrically engaging with the internal printed circuit board and mechanically engaging with the magnetic module and the electronic component.

2. The electrical connector according to claim 1, wherein the electronic component is a power module for providing the internal printed circuit board a predetermined voltage.

3. The electrical connector according to claim 1, wherein the internal printed circuit board includes a resistive and capacitive array.

4. The electrical connector according to claim 3, wherein the magnetic module acts as a signal conditioning device.

5. An electrical connector comprising:
   an insulative housing including at least one cavity;
   a plurality of contacts extending into the at least one cavity;
   an upper and a lower internal printed circuit board electrically connected with each other, the upper internal printed circuit board includes a plurality of electronic elements mounted thereon, the lower internal printed circuit board includes a plurality of electronic elements mounted thereon; and
   a power module providing the upper and lower internal printed circuit board a predetermined voltage.

6. The electrical connector according to claim 5 further includes a rear ground plate, the rear ground plate including an upper grounding connecting with one of the upper and lower printed circuit board, and a lower grounding contact for electrically engaging with the corresponding grounding through holes of the main printed circuit board.

7. An electronic connector comprising:
   an insulative housing defining at least one cavity;
   a plurality of contacts received in the housing and extending into the at lest one cavity;
   a noise suppressing module electrically connecting with the plurality of contacts and received in the housing; and
   a power source electrically connecting with the noise suppressing module for providing the noise suppressing module a predetermined voltage;
   wherein a grounding plate fastens to the noise suppressing module;
   wherein said noise suppressing module and said power source are both mounted on a printed circuit board, via which said noise suppressing module electrically connects to both the contacts and the power source; and
   wherein said grounding plate is mechanically and electrically connected to said printed circuit board.

* * * * *